United States Patent
Reznicek et al.

(10) Patent No.: US 10,916,651 B2
(45) Date of Patent: *Feb. 9, 2021

(54) BODY CONTACT IN FIN FIELD EFFECT TRANSISTOR DESIGN

(71) Applicant: INTERNATIONAL BUSINESS MACHINES CORPORATION, Armonk, NY (US)

(72) Inventors: Alexander Reznicek, Troy, NY (US); Tak H. Ning, Yorktown Heights, NY (US); Jeng-Bang Yau, Yorktown Heights, NY (US); Bahman Hekmatshoartabari, White Plains, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/794,473

(22) Filed: Feb. 19, 2020

(65) Prior Publication Data

US 2020/0185516 A1 Jun. 11, 2020

Related U.S. Application Data

(62) Division of application No. 15/989,802, filed on May 25, 2018, now Pat. No. 10,629,730.

(51) Int. Cl.
*H01L 29/78* (2006.01)
*H01L 29/66* (2006.01)
(Continued)

(52) U.S. Cl.
CPC ...... *H01L 29/783* (2013.01); *H01L 21/28185* (2013.01); *H01L 21/28194* (2013.01);
(Continued)

(58) Field of Classification Search
CPC ............ H01L 29/783; H01L 29/42368; H01L 21/28185; H01L 29/7856; H01L 21/31116;
(Continued)

(56) References Cited

U.S. PATENT DOCUMENTS 6,720,619 B1   4/2004  Chen et al.
7,205,609 B2*  4/2007  Lee ................. H01L 21/823412
                                                           257/346

(Continued)

OTHER PUBLICATIONS

Assaderaghi, F. et al., "A Novel Silicon-On-Insulator (SOI) MOSFET for Ultra Low Voltage Operation" IEEE Symposium on Low Power Electronics (Oct. 1994) pp. 58-59.
(Continued)

*Primary Examiner* — Savitri Mulpuri
(74) *Attorney, Agent, or Firm* — Tutunjian & Bitetto, P.C.; Robert Sullivan

(57) ABSTRACT

A method for forming the semiconductor device that includes forming a gate opening to a channel region of a fin structure; and forming a dielectric layer on the fin structure, in which an upper portion of the fin structure is exposed. A metal is formed within the gate opening. The portions of the metal directly contacting the upper surface of fin structure provide a body contact. The combination of the metal within the gate opening to the channel region of the fin structure and the dielectric layer provide a functional gate structure to the semiconductor device.

8 Claims, 10 Drawing Sheets

(51) Int. Cl.
*H01L 21/28* (2006.01)
*H01L 21/311* (2006.01)
*H01L 29/423* (2006.01)

(52) U.S. Cl.
CPC .. *H01L 21/31116* (2013.01); *H01L 29/42368* (2013.01); *H01L 29/66545* (2013.01); *H01L 29/66795* (2013.01); *H01L 29/7856* (2013.01)

(58) Field of Classification Search
CPC ......... H01L 29/66795; H01L 29/66545; H01L 29/6656
See application file for complete search history.

(56) References Cited

U.S. PATENT DOCUMENTS

| | | | |
|---|---|---|---|
| 7,517,764 B2* | 4/2009 | Booth, Jr. | H01L 29/66795 257/E21.442 |
| 7,609,551 B2 | 10/2009 | Shino et al. | |
| 7,829,421 B2* | 11/2010 | Wei | H01L 29/78684 438/300 |
| 7,943,986 B2 | 5/2011 | Yang et al. | |
| 8,735,984 B2 | 5/2014 | Yin et al. | |
| 8,809,139 B2* | 8/2014 | Huang | H01L 21/823807 257/E21.176 |
| 9,024,387 B2 | 5/2015 | Erickson et al. | |
| 9,412,656 B2* | 8/2016 | Fu | H01L 21/76879 |
| 9,472,628 B2* | 10/2016 | Cheng | H01L 29/267 |
| 9,595,595 B2* | 3/2017 | Cheng | H01L 21/823864 |
| 9,960,254 B1* | 5/2018 | Bao | H01L 29/66666 |
| 10,109,740 B2* | 10/2018 | Adusumilli | H01L 29/7851 |
| 10,229,986 B1* | 3/2019 | Jagannathan | H01L 21/28247 |
| 2006/0197140 A1 | 9/2006 | Muralidhar et al. | |
| 2009/0008705 A1* | 1/2009 | Zhu | H01L 29/66795 257/327 |
| 2009/0160741 A1* | 6/2009 | Inoue | G09G 3/3233 345/76 |
| 2011/0012202 A1* | 1/2011 | Chang | H01L 27/088 257/350 |
| 2017/0005091 A1 | 1/2017 | Joshi et al. | |

OTHER PUBLICATIONS

List of IBM Patents or Patent Applications Treated as Related dated Feb. 19, 2020, 2 pages.

* cited by examiner

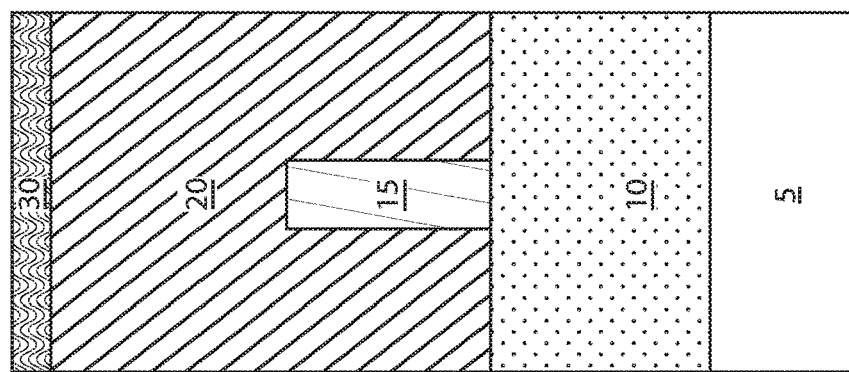
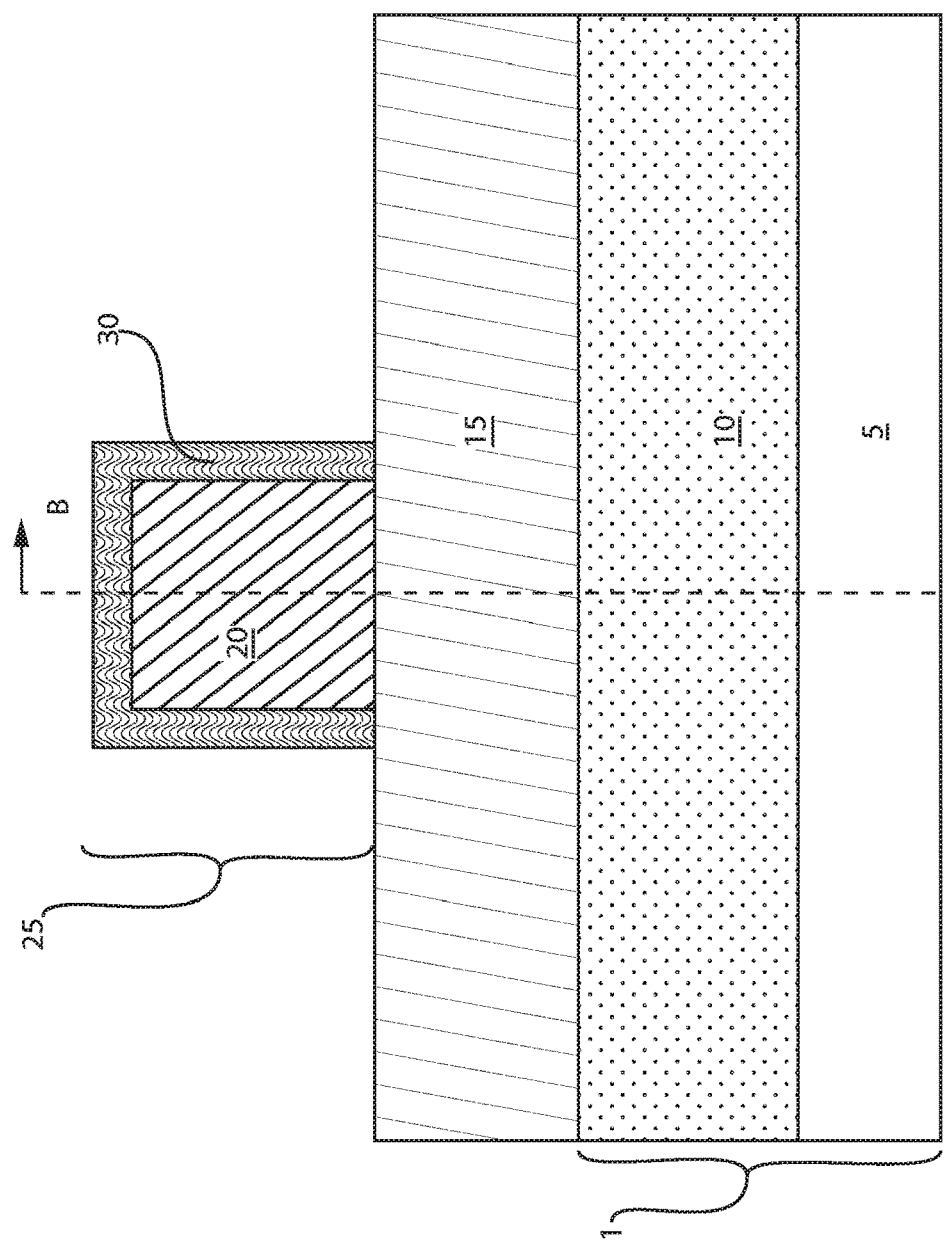
FIG. 3A
FIG. 3B

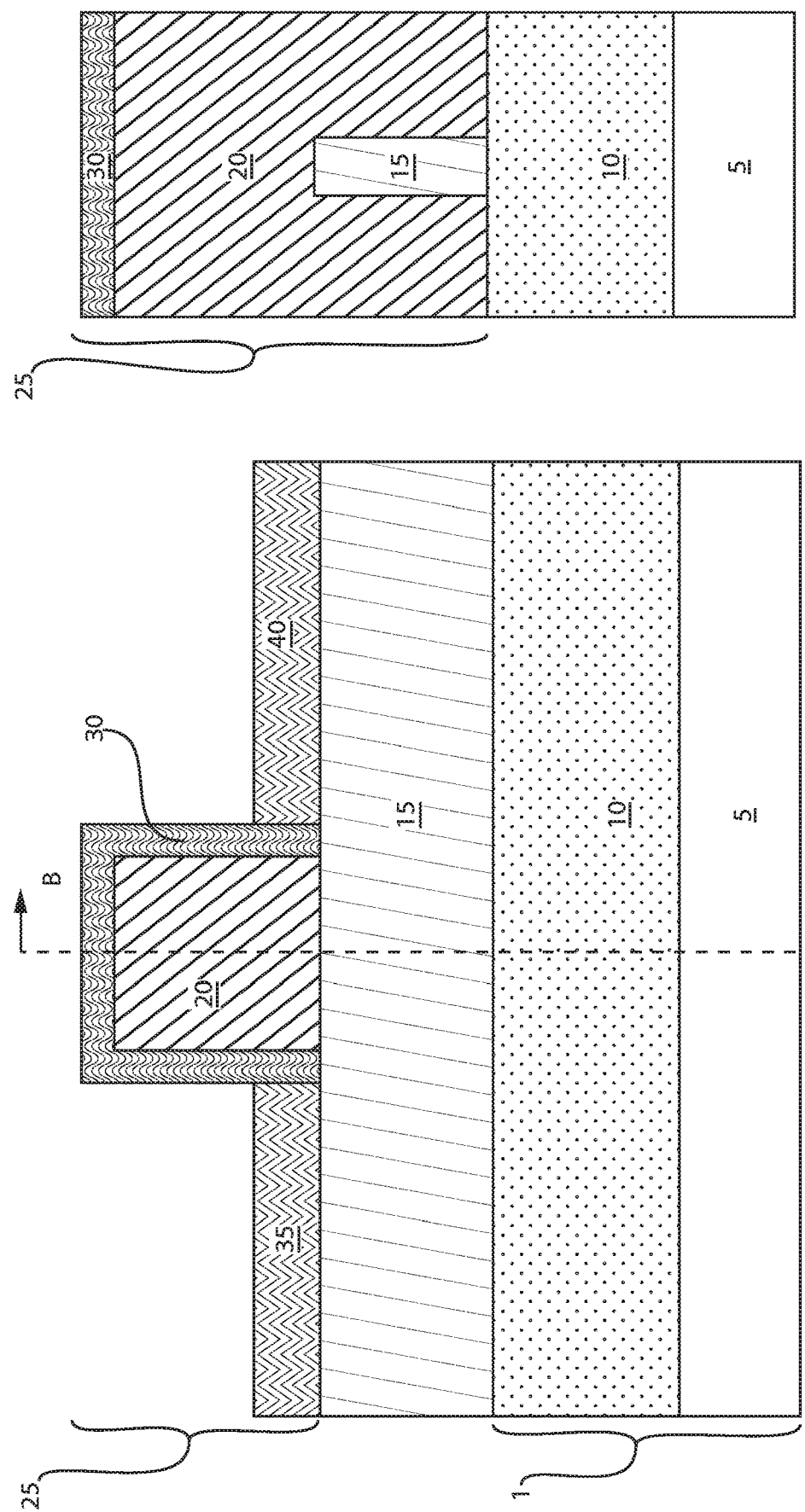

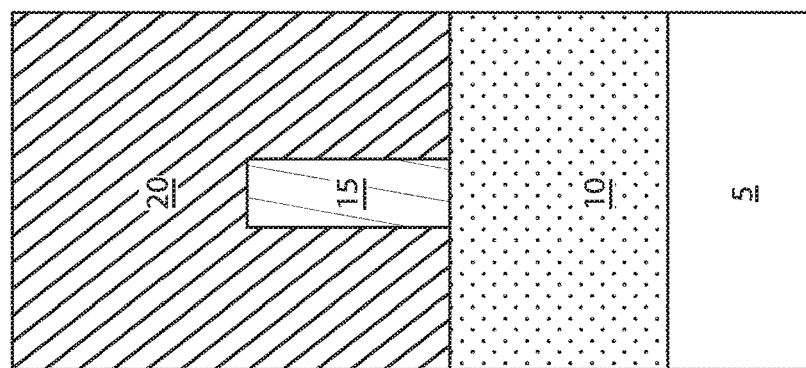
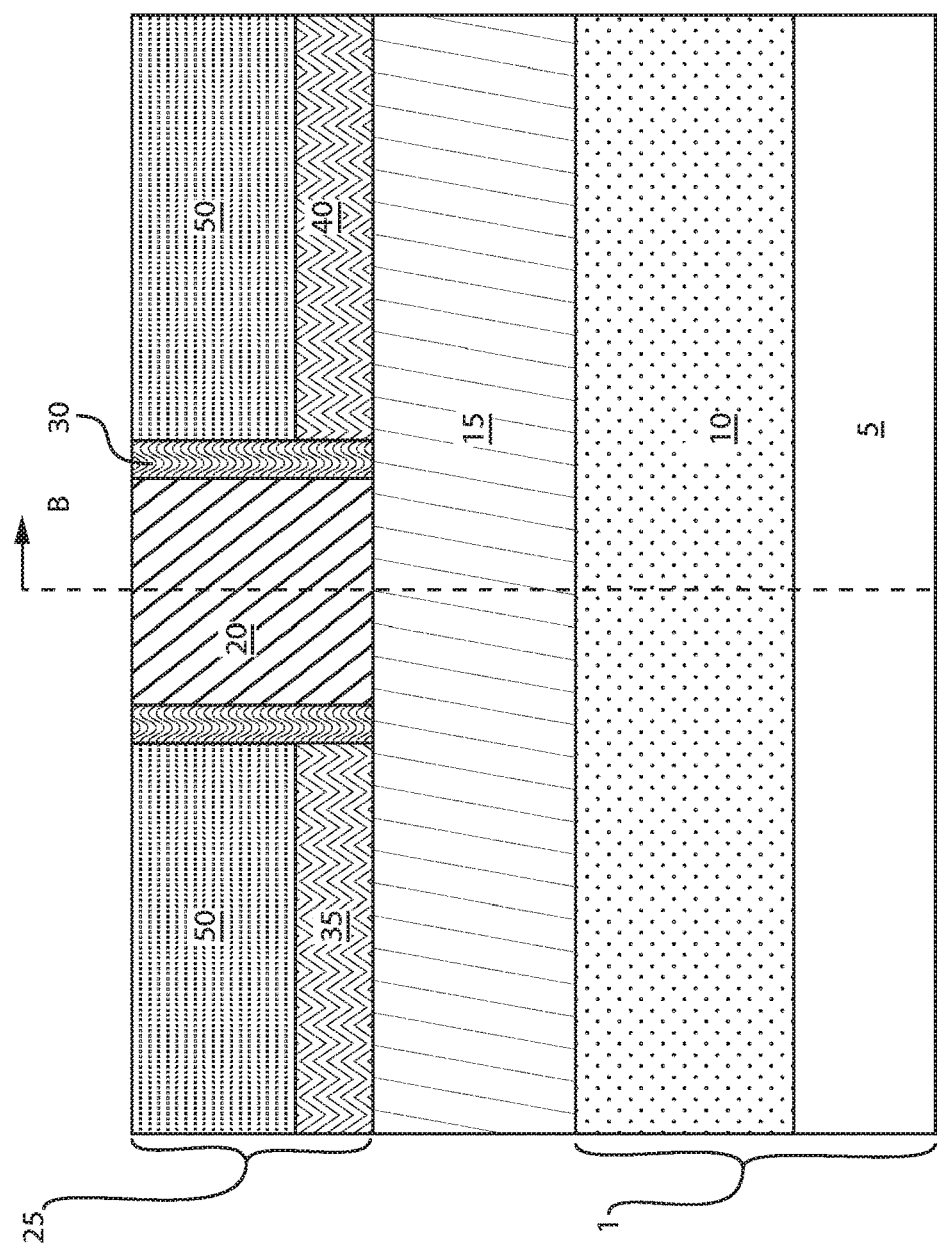
FIG. 5B
FIG. 5A

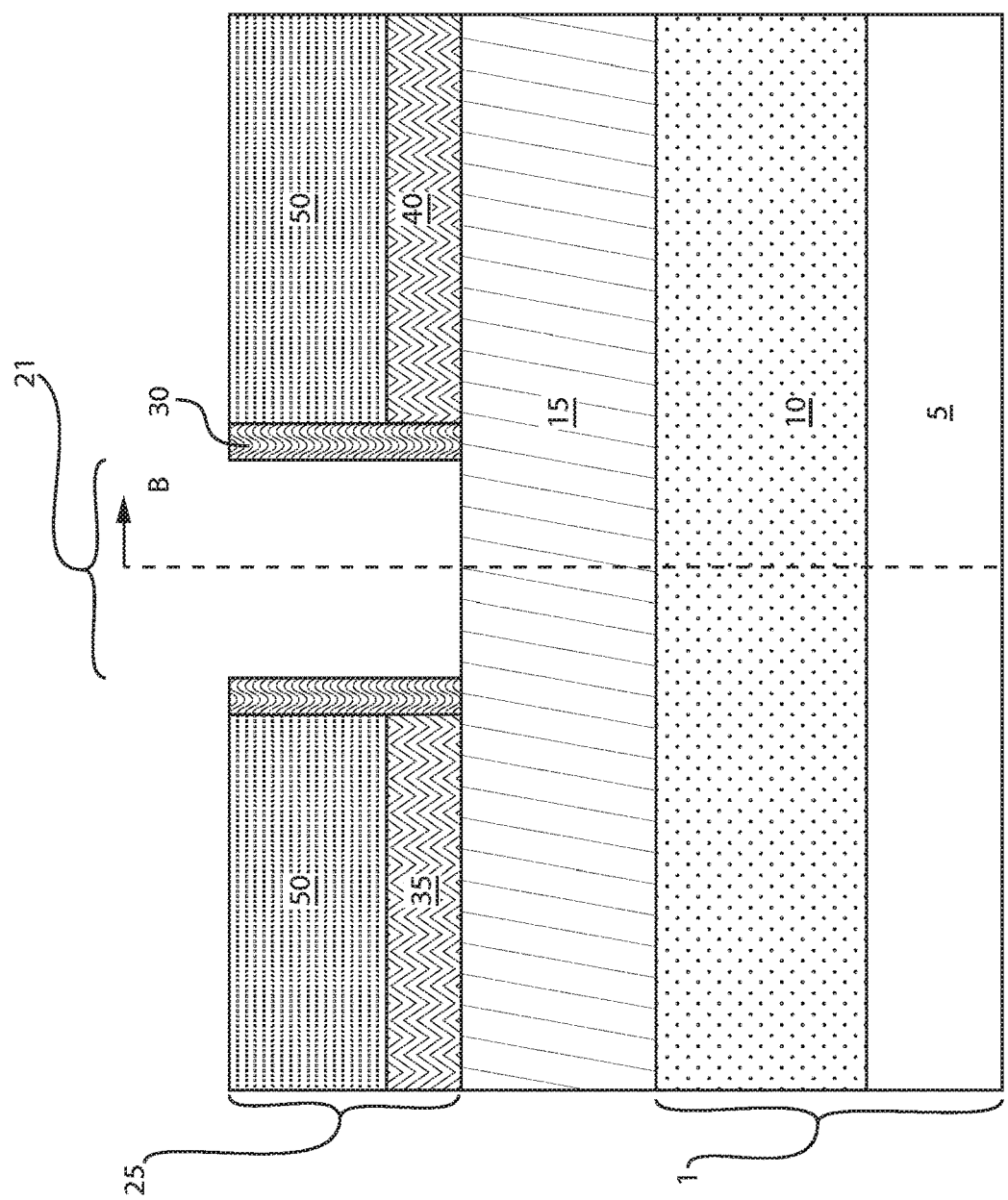
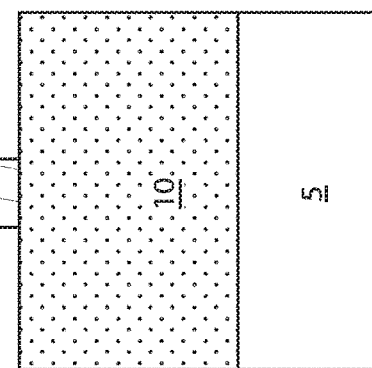

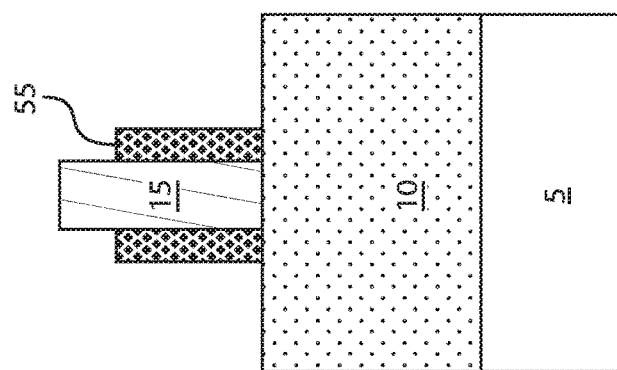
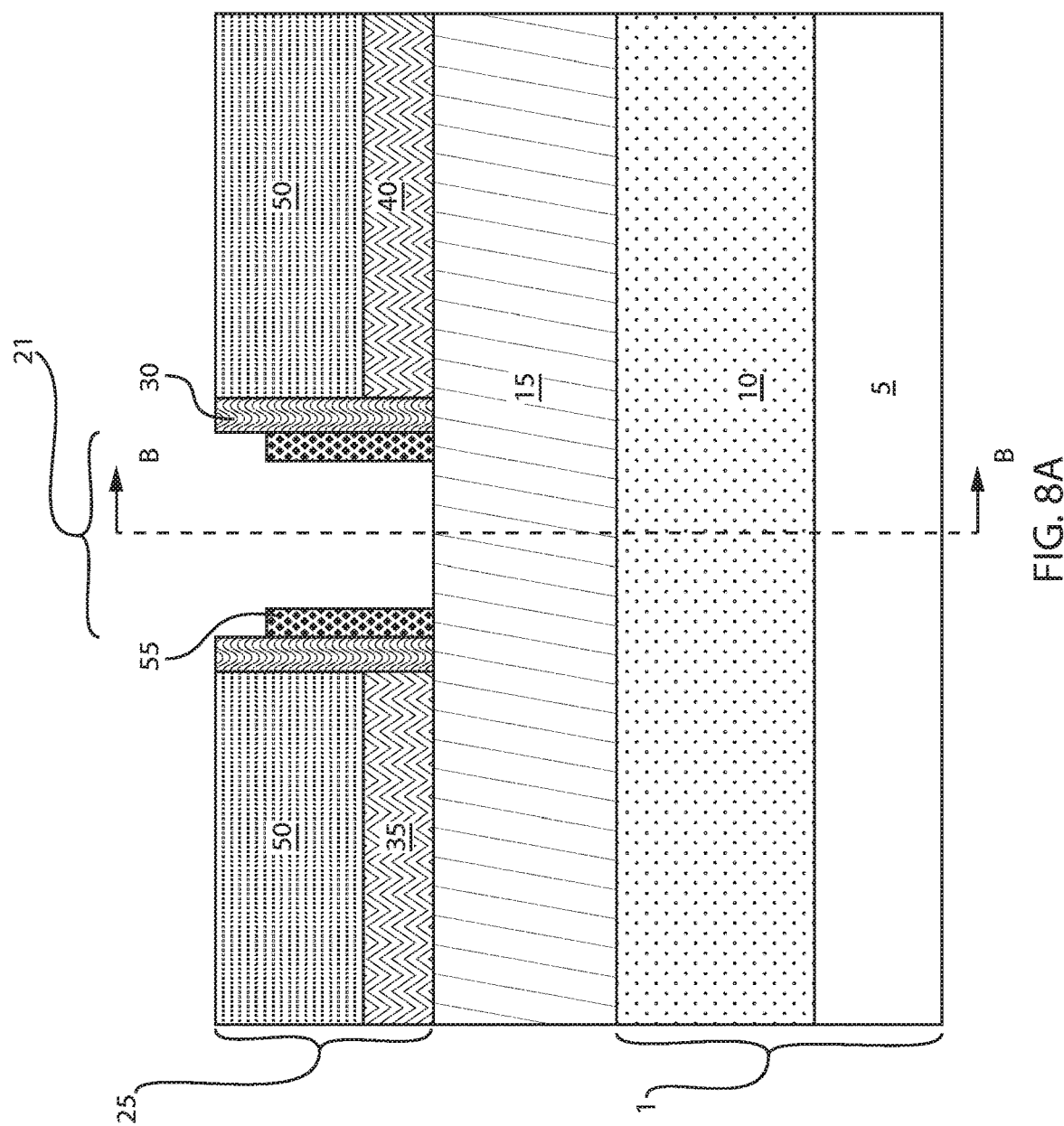

BODY CONTACT IN FIN FIELD EFFECT TRANSISTOR DESIGN

BACKGROUND

Technical Field

The present disclosure relates to semiconductor devices, such as semiconductor devices including fin structures.

Description of the Related Art

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate. With conventional planar FET scaling reaching fundamental limits, the semiconductor industry is looking at more unconventional geometries that will facilitate continued device performance improvements. One such class of device is a fin field effect transistor (FinFET).

SUMMARY

In one aspect, a method of forming a Fin field effect transistor (FinFET) is provided that includes a body contact. In one embodiment, the method for forming the semiconductor device may include forming a gate opening to a channel region of a fin structure; and forming a dielectric layer on the fin structure, in which an upper portion of the fin structure is exposed. A metal is formed within the gate opening. The portions of the metal directly contacting the upper surface of fin structure provide a body contact. The combination of the metal within the gate opening to the channel region of the fin structure and the dielectric layer provide a functional gate structure to the semiconductor device.

In another embodiment, the method of forming the semiconductor device includes doping a fin structure to a partially depleted dopant level; forming a sacrificial gate structure on a channel portion of the fin structure. Source and drain regions for the device are formed. A dielectric layer is deposited and the sacrificial gate structure is removed to provide a gate opening to the channel portion of the fin structure. A dielectric layer is formed on the channel portion of fin structure, in which an upper portion of the fin structure is exposed. A metal is formed within the gate opening. The portions of the metal directly contacting the upper surface of fin structure provide a body contact. The combination of the metal within the gate opening to the channel region of the fin structure and the dielectric layer provide a functional gate structure to the semiconductor device.

In another aspect, a semiconductor device is provided which includes a body contact to a FinFET. In one embodiment, the semiconductor device includes a fin structure having a channel region portion. A gate structure is present on the channel region portion including a high-k dielectric and a metal gate electrode. An upper portion of the channel region portion of the fin structure at which the high-k dielectric is not present is in direct contact with the metal gate electrode to provide the body contact to the device.

BRIEF DESCRIPTION OF DRAWINGS

The following detailed description, given by way of example and not intended to limit the disclosure solely thereto, will best be appreciated in conjunction with the accompanying drawings, wherein like reference numerals denote like elements and parts, in which:

FIG. 2A is a side cross-sectional view along section line a-a of an initial structure used in accordance with one embodiment of the present disclosure, in which FIG. 2A depicts forming a plurality of fin structures.

FIG. 3A is a side cross-sectional view depicting forming a sacrificial gate structure on the structure depicted in FIG. 2A.

FIG. 3B is a side cross-sectional view along section line b-b of FIG. 3A.

FIG. 4A is a side cross-sectional view depicting forming epitaxial source and drain regions on the source and rain region portions of the fin structures depicted in FIG. 3A.

FIG. 4B is a side cross-sectional view along section line b-b of FIG. 4A.

FIG. 5A is a side cross-sectional view depicting forming an interlevel dielectric layer having an upper surface that is coplanar with the upper surface of the sacrificial gate structure.

FIG. 5B is a side cross-sectional view along section line b-b of FIG. 5A.

FIG. 6A is a side cross-sectional view of removing at least a portion of the sacrificial gate structure depicted in FIG. 5A to provide a gate opening to a channel region portion of the fin structure, in accordance with one embodiment of the present disclosure.

FIG. 6B is a side cross-sectional view along section line b-b of FIG. 6A.

FIG. 8A is a is a side cross-sectional view depicting removing portions of the high-k dielectric material layer from the structure depicted in FIG. 7A, in which the portions of the high-k dielectric material layer are removed where the body contact for the device is being formed, in accordance with one embodiment of the present disclosure.

FIG. 8B is a side cross-sectional view along section line b-b of FIG. 8A.

DETAILED DESCRIPTION OF THE PREFERRED EMBODIMENTS

Figure 1:
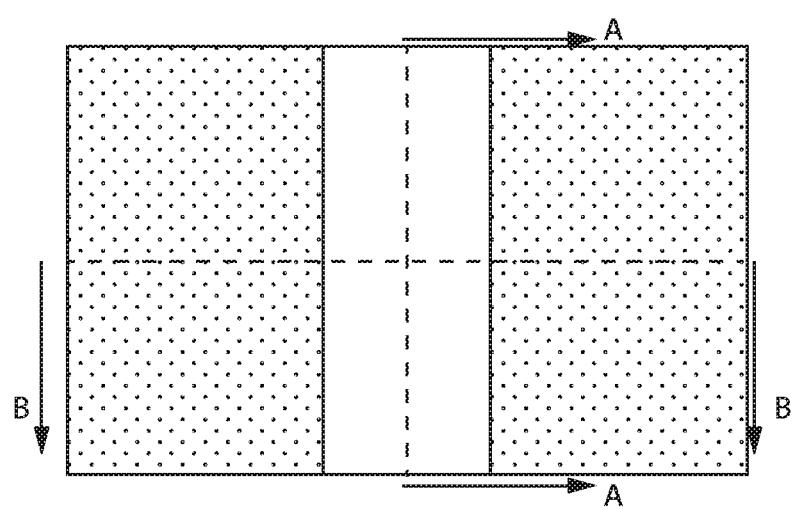
FIG. 1 is a top-down view depicting a fin structure for illustrating section lines a-a and b-b as used in the following figure descriptions.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

In some embodiments, the methods and structures disclosed herein form a FinFET semiconductor device that includes a body contact. A field effect transistor (FET) is a semiconductor device in which output current, i.e., source-drain current, is controlled by the voltage applied to a gate structure to the semiconductor device. A field effect transistor has three terminals, i.e., gate structure, source region and drain region. As used herein, a "fin structure" refers to a semiconductor material, which is employed as the body of a semiconductor device, in which the gate structure is positioned around the fin structure such that charge flows down the channel on the two sidewalls of the fin structure and optionally along the top surface of the fin structure. A FinFET is a semiconductor device that positions the channel region of the semiconductor device in a fin structure. The source and drain regions of the fin structure are the portions of the fin structure that are on opposing sides of the channel region of the fin structure.

A "body contact" is a contact made between the gate structure and an un-depleted portion of the body. In some embodiments, with a body contact, the body potential is raised as the gate potential is raised. In some embodiments, for devices including a body contact, the effective threshold voltage is reduced as the body potential is raised. In some embodiments, for devices including a body contact, the effective drive current is increased as the effective threshold voltage is reduced.

In some embodiments, the methods and structures described herein provide for the fabrication of a FinFET with dynamic threshold voltage control that is enabled by the body contact. As used herein, "threshold voltage" is the lowest attainable gate voltage that will turn on a semiconductor device, e.g., transistor, by making the channel of the device conductive. As will be further described below, the FinFET device including the body contact that is described herein provides for dynamic/tunable control of the standard threshold voltage defined by the workfunction of the gate metal to meet target device operation requirements, e.g., a lower threshold voltage $V_T$ for high performance operation of semiconductor devices. The FinFET device provides for dynamic/tunable control of the standard threshold voltage defined by the workfunction of the gate metal without involving integration of metal materials with different work functions, as used in prior devices not included a body contact. The structures and devices of the present disclosure also provide for Fin isolation, e.g., isolation by semiconductor on insulator (SOI) construction or bulk-fin-bottom insulation, which advantageously provides for reduced junction capacitance, e.g., lower power consumption, and low off state current, e.g., low leakage. Further, when employing a body contact, the FinFET designs described herein are not subjected to floating body effects, when compared to planar partially depleted semiconductor, e.g., silicon, on insulator (PDSOI) semiconductor designs. Additionally, the methods described herein for creating the body contact can maintain device compactness without increasing the device area, i.e., without increasing the active region of the device. The methods and structures of the present disclosure are now discussed with more detail referring to FIGS. 1-10B.

Figure 2A:
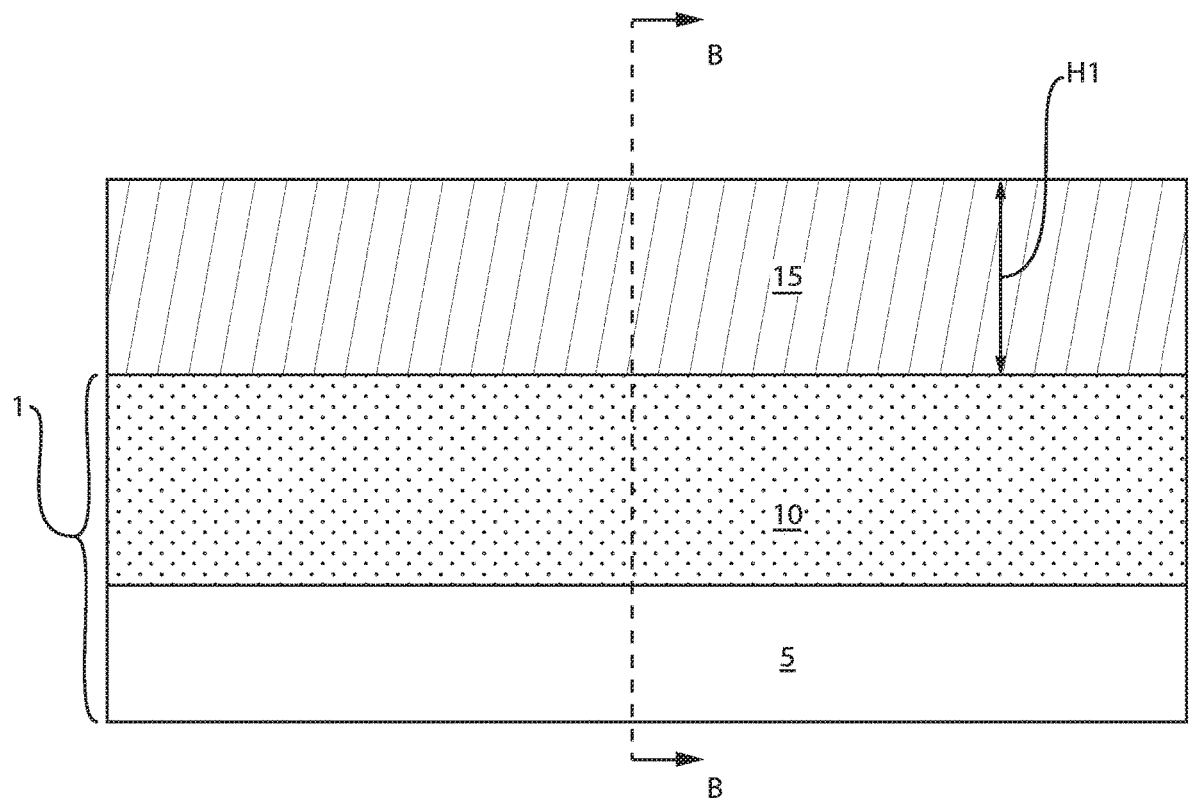
Figure 2B:
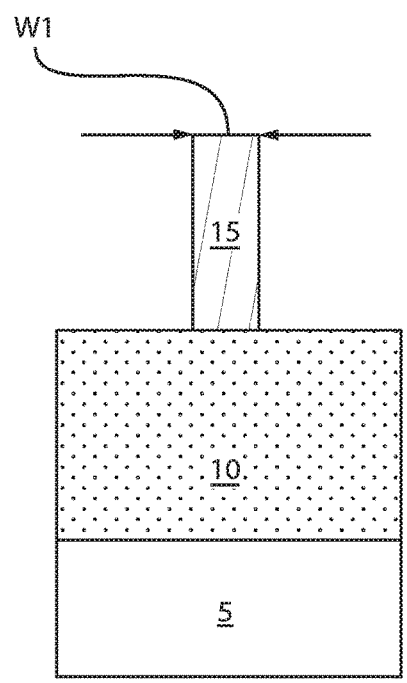
FIG. 2B is a side cross-sectional view along second line b-b of FIG. 2A.

FIGS. 1-2B depict one embodiment of forming a fin structure 15 from a semiconductor substrate 1. Although FIGS. 1-2B illustrate a single fin structure 15, any plurality of fin structures 15 may be formed on the substrate 1. In FIG. 1A, the fin structure 15 is formed from the semiconductor, e.g., silicon (Si), on insulator (SOI) layer over a semiconductor, e.g., silicon (Si), on insulator (SOI) substrate, in which the buried insulating layer 10, e.g., buried oxide layer (BOX), of the SOI substrate 1 is present underlying the fin structure 15, and a base supporting substrate 5 is present under the buried insulating layer 10. It is not necessary that the fin structure 15 be formed from the SOI layer of an SOI substrate. In some embodiments, the fin structure 15 may be formed from a bulk semiconductor substrate. In the embodiments, in which the fin structure 15 is formed on a bulk semiconductor substrate, bottom isolation via a punch through stopping (PTS) region may be employed.

The fin structure 15 may be formed from the semiconductor substrate 1 using photolithography and etch processes. In one embodiment, the patterning process used to define each of the fin structures 15 is a sidewall image transfer (SIT) process. The SIT process can include forming a mandrel material layer (not shown) on the material layer that provides the fin structures 15, such as the SOI layer of an SOI substrate, or the bulk semiconductor substrate upper surface. The mandrel material layer can include any material (semiconductor, dielectric or conductive) that can be selectively removed from the structure during a subsequently performed etching process. In one embodiment, the mandrel material layer may be composed of amorphous silicon or polysilicon. In another embodiment, the mandrel material layer may be composed of a metal, such as, e.g., aluminum (Al), tungsten (W), or copper (Cu). The mandrel material layer can be formed by a deposition method, such as chemical vapor deposition or plasma enhanced chemical vapor deposition. Following deposition of the mandrel material layer, the mandrel material layer can be patterned by lithography and etching to form a plurality of mandrel structures on the topmost surface of the semiconductor containing material that provides the fin structures 15, e.g., the SOI layer of an SOI substrate.

In some embodiments, the SIT process may continue by forming a dielectric spacer on each sidewall of each mandrel structure. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process, such as, e.g., reactive ion etching (RIE). Since the dielectric spacers are used in the SIT process as an etch mask, the width of the each dielectric spacer determines the width of each fin structure 15.

In some embodiments, after formation of the dielectric spacers, the SIT process continues by removing each mandrel structure. Each mandrel structure can be removed by an etching process that is selective for removing the mandrel material as compared to silicon. Following the mandrel structure removal, the SIT process continues by transferring the pattern provided by the dielectric spacers into the semiconductor material layer that provides the fin structure 5, such as the SOI layer of an SOI substrate. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. The etching steps pattern the semiconductor material layer to provide the fin structure 15. Following etching, i.e., pattern transfer, the SIT process may conclude with removing the dielectric spacers using an etch process or a planarization process.

It is noted that the aforementioned sidewall image transfer (SIT) process is only one method of forming a fin structure 15. In another embodiment, the fin structures 15 may be formed using a photoresist etch mask. Specifically, in one example, a photoresist mask is formed overlying the semiconductor composition layer which provides the fin structure 5. The exposed portions of the semiconductor layer that provides the fin structure 5 that are not protected by the photoresist mask are removed using a selective etch process. To provide the photoresist mask, a photoresist layer is first positioned on the semiconductor layer that provides the fin structure 5, e.g., SOI layer of an SOI substrate or upper surface of bulk semiconductor substrate. The photoresist layer may be provided by a blanket layer of photoresist material that is formed utilizing a deposition process such as, e.g., plasma enhanced CVD (PECVD), evaporation or spin-on coating.

The blanket layer of photoresist material is then patterned to provide the photoresist mask utilizing a lithographic process that may include exposing the photoresist material to a pattern of radiation and developing the exposed photoresist material utilizing a resist developer. Following the formation of the photoresist mask, an etching process may remove the unprotected portions of the semiconductor layer that provides the fin structure 5. The etch process may be an anisotropic process, such as reactive ion etch (RIE).

Referring to FIGS. 2A and 2B, the fin structure 15 may have a height $H_1$ ranging from 5 nm to 200 nm. In another embodiment, the fin structure 15 may have a height $H_1$ ranging from 10 nm to 100 nm. In one example, the fin structure 5 may have a height $H_1$ ranging from 20 nm to 50 nm. The fin structure 5 may have a width $W_1$ of less than 20 nm. In another embodiment, the fin structures 5 have a width $W_1$ ranging from 6 nm to 8 nm. In embodiments including a plurality of fin structures 15, the pitch separating adjacent fin structures 15 may range from 10 nm to 500 nm. In another example, the pitch separating adjacent fin structures in the plurality of fin structures 15 may range from 20 nm to 50 nm.

In some embodiments, the fin structure 15 may be composed of a silicon including material that provides the semiconductor substrate 1, which may include, but is not limited to silicon, single crystal silicon, multicrystalline silicon, polycrystalline silicon, amorphous silicon, strained silicon, silicon doped with carbon (Si:C), silicon alloys or any combination thereof. The fin structure 15 may also be composed of germanium including semiconductor materials, such as silicon germanium (SiGe) or germanium (Ge). The fin structure 15 may also be composed of a type III-V semiconductor material, such as gallium arsenide (GaAs).

In some embodiments, the fin structure 15 may be doped with an n-type or p-type dopant. The dopant that is introduced to the channel region portion of the fin structure 15 provides the ultimately formed FinFET functions as a partially depleted device, as opposed to functioning as a fully depleted device, as in typical FinFET operation. A partially depleted FinFET maintains a finite quasineutral doped region in the channel during device operation. For a partially depleted device, the channel region portion has a dopant type that is opposite the dopant type of its source and drain regions. To maintain a finite quasineutral region in the channel during device operation, the channel region has to be sufficiently heavily doped. The required dopant concentration in the channel is a function of the width of the fin structure 15. The smaller the width of the fin structure, the larger the required channel dopant concentration. For example, for a fin structure width of 50 nm, the channel dopant concentration should be larger than $1 \times 10^{18}$ atoms/$cm^3$. For a fin structure width of 25 nm, the channel dopant concentration should be larger than $4 \times 10^{18}$ atoms/$cm^3$. The dopant, i.e., n-type or p-type dopant, can be introduced to the fin structure 15 by ion implantation. In other embodiments, the dopant, i.e., n-type or p-type dopant, can be introduced to the fin structure 15 by gas phase doping.

FIGS. 3A and 3B depict forming a sacrificial gate structure 25 on the structure depicted in FIGS. 2A and 2B. In one embodiment, the sacrificial gate structure 25 may be formed contacting the channel region of the fin structure 15. The term "sacrificial" as used to describe the replacement gate conductor denotes that the structure is present during the process sequence, but is not present in the final device structure, in which the replacement structure provides an opening that dictates the size and geometry of a later formed functional gate conductor.

The sacrificial material that provides the sacrificial gate electrode 20 of the sacrificial gate structure 25 may be composed of any material that can be etched selectively to the underlying fin structures 15. In one embodiment, the sacrificial material that provides the sacrificial gate electrode 20 may be composed of a silicon-containing material, such as polysilicon. Although, the sacrificial gate electrode 20 is typically composed of a semiconductor material, the sacrificial gate electrode 20 may also be composed of a dielectric material, such as an oxide, nitride or oxynitride material, or amorphous carbon.

The sacrificial material may be patterned and etched to provide the sacrificial gate electrode 20. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections if the sacrificial material covered by the photoresist are protected to provide the sacrificial gate electrode 20, while the exposed regions are removed using a selective etching process that removes the unprotected regions. Following formation of sacrificial gate electrode 20, the photoresist may be removed.

At least one dielectric gate spacer 30 may then be formed on the sidewall and the upper surface of the sacrificial gate electrode 20. In one embodiment, the dielectric gate spacer 30 may be formed by using a blanket layer deposition, such as CVD, and an anisotropic etch. The dielectric gate spacer 30 may have a conformal thickness. The at least one dielectric gate spacer 30 may be composed of a layer having a conformal thickness. The dielectric gate spacer 30 may have a thickness ranging from 2.0 nm to 15.0 nm, and may be composed of a dielectric, such as a nitride, oxide, oxynitride, or a combination thereof.

FIGS. 4A and 4B depict forming epitaxial source and drain regions on the source and rain region portions 35, 40 of the fin structures depicted in FIGS. 3A and 3B. The epitaxial source and drain region portions 35, 40 are formed on the source and drain region portions of the fin structure 15 that are present on opposing sides of the gate structure 25, as well as being on opposing sides of the channel region portion of the fin structure 15. The epitaxial source and drain region portions 35, 40 are doped to the conductivity type of the device. For example, if the FinFET is an n-type FinFET, the epitaxial source and drain region portions 35, 40 are doped to an n-type conductivity; and if the FinFET is a p-type FinFET, the epitaxial source and drain region portions 35, 40 are doped to a p-type conductivity.

In some embodiments, the epitaxial source and drain region portions 35, 40 may be composed of silicon, a silicon carbon alloy (e.g., silicon doped with carbon (Si:C)), silicon germanium, a silicon germanium and carbon alloy (e.g., silicon germanium doped with carbon (SiGe:C)), silicon alloys, germanium, germanium alloys, gallium arsenic, indium arsenic, indium phosphide, as well as other III/V and II/VI compound semiconductors. The epitaxial source and drain region portions 35, 40 is grown using an epitaxial growth or deposition process. "Epitaxial growth and/or deposition" means the growth of a semiconductor material on a deposition surface of a semiconductor material, e.g., the exposed surface of the fin structures 15 having the first orientation, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, an epitaxial film deposited on a {100} crystal surface will take on a {100} orientation.

A number of different sources may be used for the epitaxial deposition of the epitaxial source and drain region portions 35, 40. For example, a silicon including first epitaxial semiconductor material may be deposited from a silicon including source gas that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the first epitaxial semiconductor material includes germane, digermane, halogermane, dichlorogermane, trichlorogermane, tetrachlorogermane and combinations thereof. The temperature for epitaxial deposition typically ranges from 450° C. to 900° C. Although higher temperature typically results in faster deposition, the faster deposition may result in crystal defects and film cracking.

The dopant for the epitaxial source and drain region portions 35, 40 may be introduced to the semiconductor material by an in situ doping process. The term "in situ" denotes that the dopant, e.g., n-type or p-type dopant, is introduced to the base semiconductor material, e.g., silicon or silicon germanium, during the formation of the base material. For example, an in situ doped epitaxial semiconductor material may introduce n-type or p-type dopants to the material being formed during the epitaxial deposition process that includes n-type or p-type source gasses. In one embodiment, the n-type gas dopant source may include arsine ($AsH_3$), phosphine ($PH_3$) and alkylphosphines, such as with the empirical formula $R_xPH_{(3-x)}$, where R=methyl, ethyl, propyl or butyl and x=1, 2 or 3. Alkylphosphines include trimethylphosphine (($CH_3)_3P$), dimethylphosphine (($CH_3)_2PH$), triethylphosphine (($CH_3CH_2)_3P$) and diethylphosphine (($CH_3CH_2)_2PH$). The p-type gas dopant source may include diborane ($B_2H_6$). The dopant for the epitaxial source and drain region portions 35, 40 that dictates the conductivity type of the epitaxial source and drain region portions 35, 40 is typically present in a concentration ranging from $1E17$ atoms/cm$^3$ to $5E19$ atoms/cm$^3$.

FIGS. 5A-5B illustrate one embodiment depicting forming an intralevel dielectric layer 50 having an upper surface that is coplanar with the upper surface of the sacrificial gate structure 25. The intralevel dielectric layer 50 may be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The interlevel dielectric layer 50 may be deposited by chemical vapor deposition (CVD), physical vapor deposition (PVD), spin on deposition, deposition from solution or a combination thereof. Following deposition, the upper surface of the intralevel dielectric layer 50 may be planarized until coplanar with the upper surface of the sacrificial electrode 20. This step of the process sequence may also remove the upper portion of the dielectric gate spacer 30 to expose the upper surface of the sacrificial electrode 20. The planarization process may be provided by chemical mechanical planarization.

The sacrificial gate structure 10 may then be removed by an etch that is selective to the fin structures 5 and the interlevel dielectric layer. The etch may also be selective to the gate sidewall spacers 11. Removing the sacrificial gate structure 10 provides a gate structure opening to the channel region portion of the fin structures 5. The functional gate structure is formed in the gate structure opening.

FIGS. 6A and 6B depict removing the sacrificial gate electrode 20 to provide a gate opening 21 to a channel region portion of the fin structure 15. The sacrificial gate electrode 20 may be removed using a selective etch process. As used herein, the term "selective" in reference to a material removal process denotes that the rate of material removal for a first material, e.g., sacrificial gate electrode 20, is greater than the rate of removal for at least another material, e.g., intralevel dielectric 50 and/or fin structure 15, of the structure to which the material removal process is being applied. For example, in one embodiment, a selective etch may include an etch chemistry that removes a first material selectively to a second material by a ratio of 10:1 or greater.

In some embodiments, the sacrificial gate electrode 20 may be removed by an anisotropic etch, such as reactive ion etching, or a wet etch.

Figure 7B:
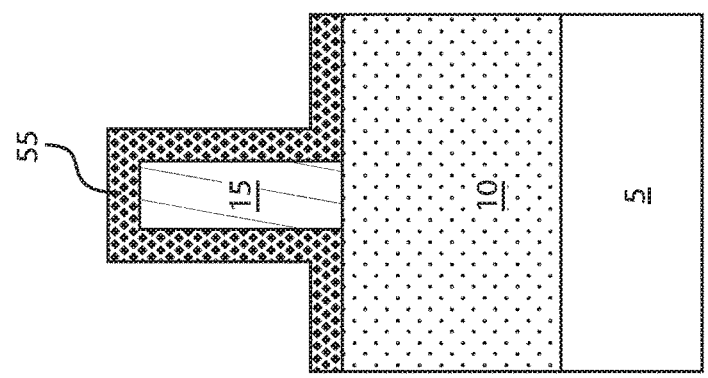
FIG. 7B is a side cross-sectional view along section line b-b of FIG. 7A.
Figure 7A:
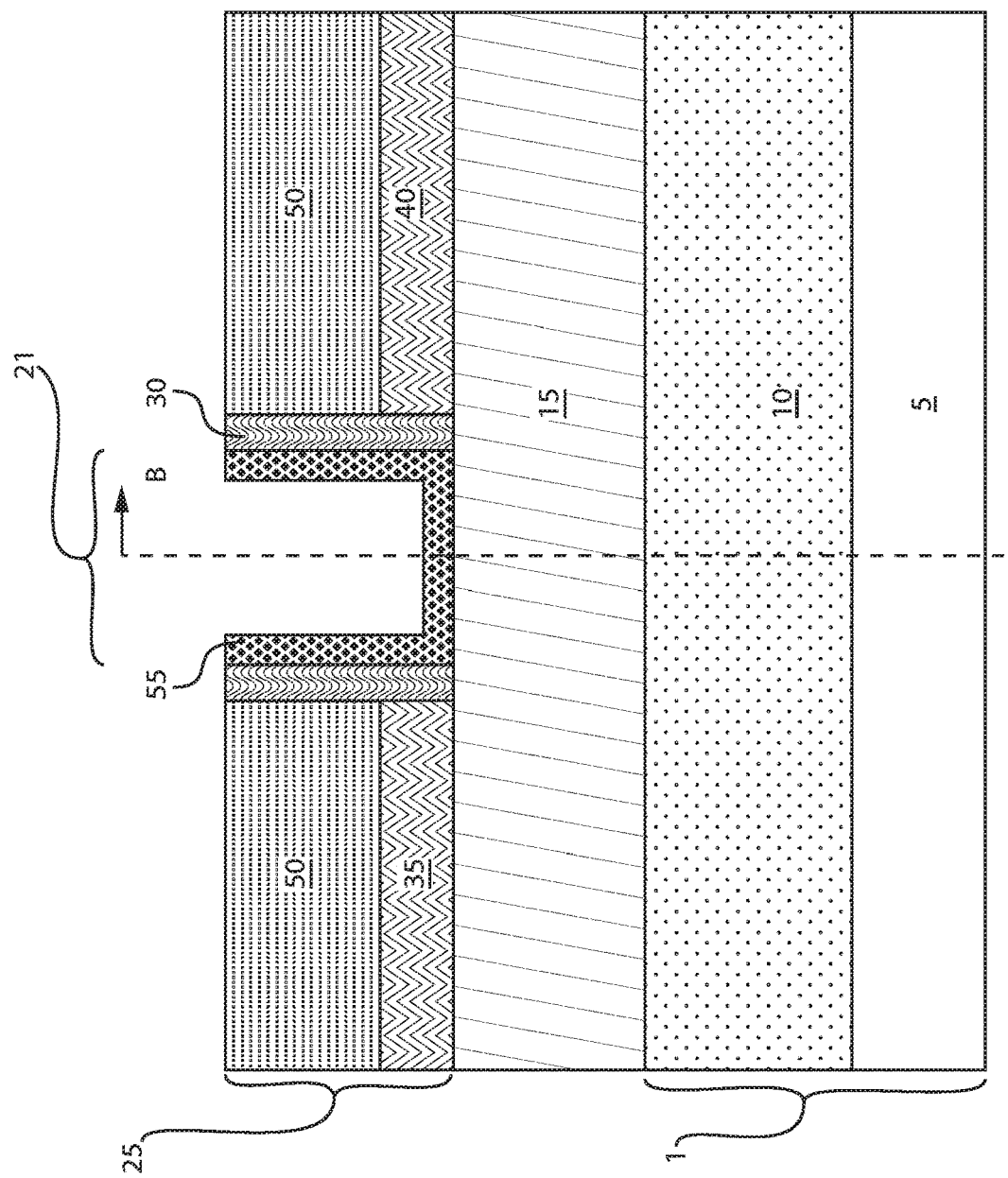
FIG. 7A is a side cross-sectional view depicting forming a high-k dielectric material layer on the gate opening that is depicted in FIG. 6A, in accordance with one embodiment of the present disclosure.

FIGS. 7A and 7B depict forming a high-k dielectric material layer 55 on the gate opening 21 that is depicted in FIGS. 6A and 6B. High-k dielectric materials, such as those used in the high-k dielectric material layer 55, have a dielectric constant greater than silicon oxide ($SiO_2$). For example, high-k dielectrics having a dielectric constant greater than 4.0 at room temperature, e.g., 20° C. to 25° C. and atmospheric pressure, e.g., 1 atm. In one embodiment, the high-k dielectric material layer 55 is composed of a high-k oxide such as, for example, $HfO_2$, $ZrO_2$, $Al_2O_3$, $TiO_2$, $La_2O_3$, $SrTiO_3$, $LaAlO_3$, $Y_2O_3$ and mixtures thereof. Other examples of high-k dielectric materials for the high-k dielectric material layer 55 include hafnium silicate, hafnium silicon oxynitride or combinations thereof.

Referring to FIGS. 7A and 7B, in one embodiment, the high-k dielectric material layer 55 is formed on the horizontally orientated upper surface and vertically orientated sidewall surfaces of the channel region portion of the fin structure 13. The high-k dielectric material layer 55 is also formed on the vertically orientated sidewall surfaces of the dielectric gate spacer 30. The high-k dielectric material layer 55 is also formed on the exposed upper surfaces of the buried insulating layer 15 within the gate opening 21, as depicted in FIG. 7A.

In one embodiment, the high-k dielectric material layer 55 may be deposited by chemical vapor deposition (CVD). Variations of CVD processes suitable for depositing the at least one gate dielectric layer include, but are not limited to, atmospheric pressure chemical vapor deposition (APCVD), low pressure chemical vapor deposition (LPCVD), plasma enhanced chemical vapor deposition (PECVD), metal organic chemical vapor deposition (MOCVD), atomic layer deposition (ALD), and combinations thereof. In other embodiments, the high-k dielectric material layer 55 is deposited by atomic layer deposition.

The high-k dielectric material layer 55 can be deposited having a conformal thickness. In one embodiment, the thickness of the high-k dielectric material layer 55 is greater than 0.8 nm. More typically, the high-k dielectric material layer 55 has a thickness ranging from about 1.0 nm to about 6.0 nm.

In some embodiments, a planarization process removes any deposited material for the high-k dielectric material that may have been deposited outside the gate opening 21. For example, a planarization process can remove the portion of the high-k dielectric material layer 55 that is present on the upper surface of the intralevel dielectric 50.

FIGS. 8A and 8B depict removing portions of the high-k dielectric material layer 55 within the gate opening 21 from the structure depicted in FIGS. 7A and 7B, in which the portions of the high-k dielectric material layer 55 are removed from where the body contact for the device is being formed. For example, the high-k dielectric material layer 55 is removed from the upper surface of the fin structure 15 within the gate opening 21. More specifically, in some embodiments, the high-k dielectric material layer 55 is removed from the upper ⅓ of the height of the fin structure 13. In other embodiments, the high-k dielectric material layer 55 is removed from the upper ¼ of the height of the fin structure 15. In further embodiments, the high-k dielectric material layer 55 is removed from the upper ⅕ of the height of the fin structure 15. In even further embodiments, the high-k dielectric material layer 55 is removed from the upper ⅛ of the height of the fin structure 15. Removing the high-k dielectric material layer 55 from the upper portion of the channel region portion of the fin structure 15 exposes the fin's upper surface and a portion of the fin's sidewall surface.

The high-k dielectric material layer 55 is removed from the upper surface of the fin structure 15 within the gate opening 21 using an anisotropic etch process. As used herein, an "anisotropic etch process" denotes a material removal process in which the etch rate in the direction normal to the surface to be etched is greater than in the direction parallel to the surface to be etched. In one embodiment, the upper portion of the high-k dielectric material layer 55 is removed from the upper surfaces of the fin structure 15 using reactive ion etching (RIE).

Reactive Ion Etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

Referring to FIGS. 8A and 8B, the etch process for recessing th high-k dielectric material layer 55 to expose the upper surfaces of the fin structure 15 within the gate opening 21 may also recess the vertical height of the high-k dielectric material that is present on the gate sidewall spacer 30. The uniform thickness of the high-k dielectric material layer 55 in combination with the anisotropic etch provides that while the vertically orientated portions of the high-k dielectric material layer 55 have a height that is recessed, the horizontally orientated portions of the high-k dielectric material layer 55 may be removed. For example, the horizontally orientated portions of the high-k dielectric material layer 55 may be removed from the upper surfaces of the fin structure 15 and the exposed upper surfaces of the buried oxide layer 10 that are present within the gate opening 21. In some embodiments, the etch process for etching the high-k dielectric material layer 55 is selective to the fin structure 15.

Figure 9A:
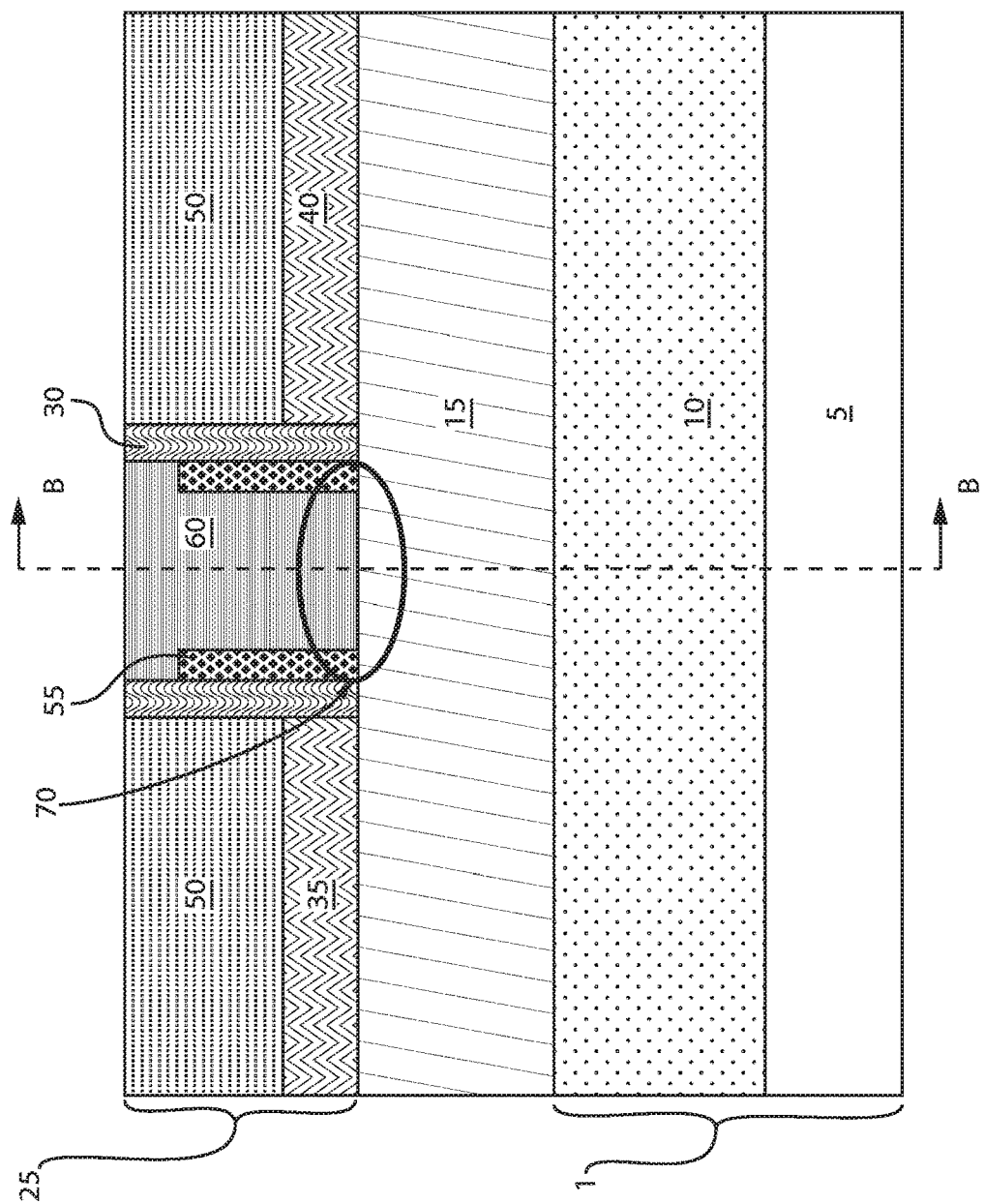
FIG. 9A is a side cross-sectional view depicting depositing a metal in the gate opening that is depicted in FIG. 8A, wherein the metal contacting exposed portions of the fin structure in the gate opening provides a body contact for the FinFET being formed.
Figure 9B:
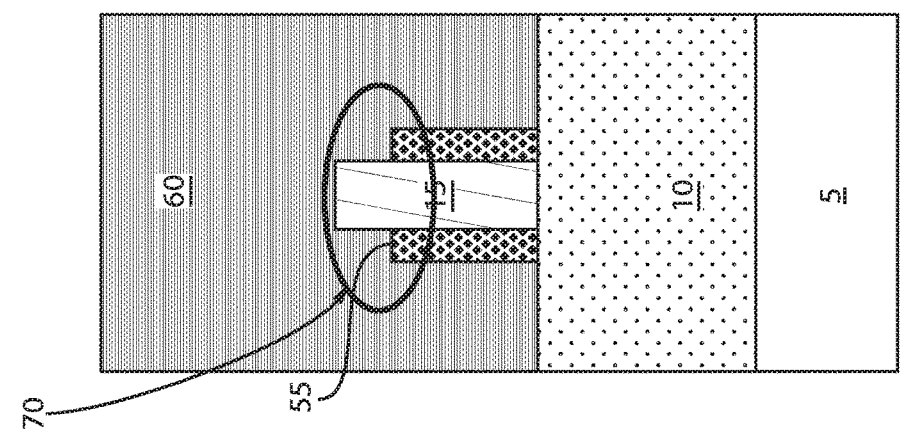
FIG. 9B is a side cross-sectional view along section line b-b of FIG. 9A.

FIGS. 9A and 9B depict depositing a metal 60 in the gate opening 21, wherein the metal 60 contacting exposed portions of the fin structure 15 in the gate opening 21 provides a body contact 70 for the FinFET being formed. The metal 60 in addition to providing a body contact 70 to the FinFET being formed also provides the gate electrode of a functional gate structure. The "functional gate structure" operates to switch the semiconductor device from an "on" to "off" state, and vice versa. The functional gate structure typically includes at least on gate dielectric and at least one gate electrode. The remaining portion of the high-k dielectric material layer 55 provides the gate dielectric of a functional gate structure.

In some embodiments, the metal 60 may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero. In one embodiment, the p-type work function metal layer may be composed of titanium and their nitrided/carbide. In one embodiment, the p-type work function metal layer is composed of titanium nitride (TiN). Therefore, in some embodiments the metal 60 may be titanium nitride (TiN), and may provide a p-type work function layer. In some other embodiments, the p-type work function metal layer is provided by a meal 60 that is composed of TiAlN, Ru, Pt, Mo, Co and alloys and combinations thereof.

In some other embodiments, the metal 60 may be an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In some embodiments, the n-type work function metal layer that provides the metal 60 is composed of at least one of TiAl, TaN, TiN, HfN, HfSi, or combinations thereof.

The metal 60 may be formed using a deposition process. The metal 60 may fill the gate opening 21. In some embodiments, the metal 60 is formed using a physical vapor deposition (PVD) process, such as sputtering. Examples of sputtering apparatus that may be suitable for depositing the at least one gate conductor include DC diode type systems, radio frequency (RF) sputtering, magnetron sputtering, and ionized metal plasma (IMP) sputtering.

The portion of the metal 60 that contacts the fin structure 15 within the gate opening is the body contact 70. In some embodiments, the metal 60 that provides the body contact 70 contacts the upper ⅓ of the height of the fin structure 13. In other embodiments, the metal 60 that provides the body contact 70 contacts the upper ¼ of the height of the fin structure 15 within the gate structure. In further embodiments, the high-k dielectric material layer 55 is removed from the upper ⅕ of the height of the fin structure 15. In even further embodiments, the metal 60 that provides the body contact 70 contacts the upper ⅛ of the height of the fin structure 15 in the gate structure. The body contact 70 contacts the upper portion of the channel region portion of the fin structure 15 and a portion of the fin's sidewall surface.

In some embodiments, a FinFET device including the body contact 70 provides for dynamic/tunable control of the standard threshold voltage defined by the workfunction of the gate metal to meet target device operation requirements, e.g., a lower threshold voltage $V_T$ for high performance operation of semiconductor devices. With the introduction of the body contact 70, the FinFET device provides for dynamic/tunable control of the standard threshold voltage defined by the workfunction of the gate metal without involving integration of metal materials with different work functions. Further, when employing the body contact 70, the FinFET design is not subjected to floating body effects, when compared to planar partially depleted semiconductor, e.g., silicon, on insulator (PDSOI) semiconductor designs.

Figure 10A:
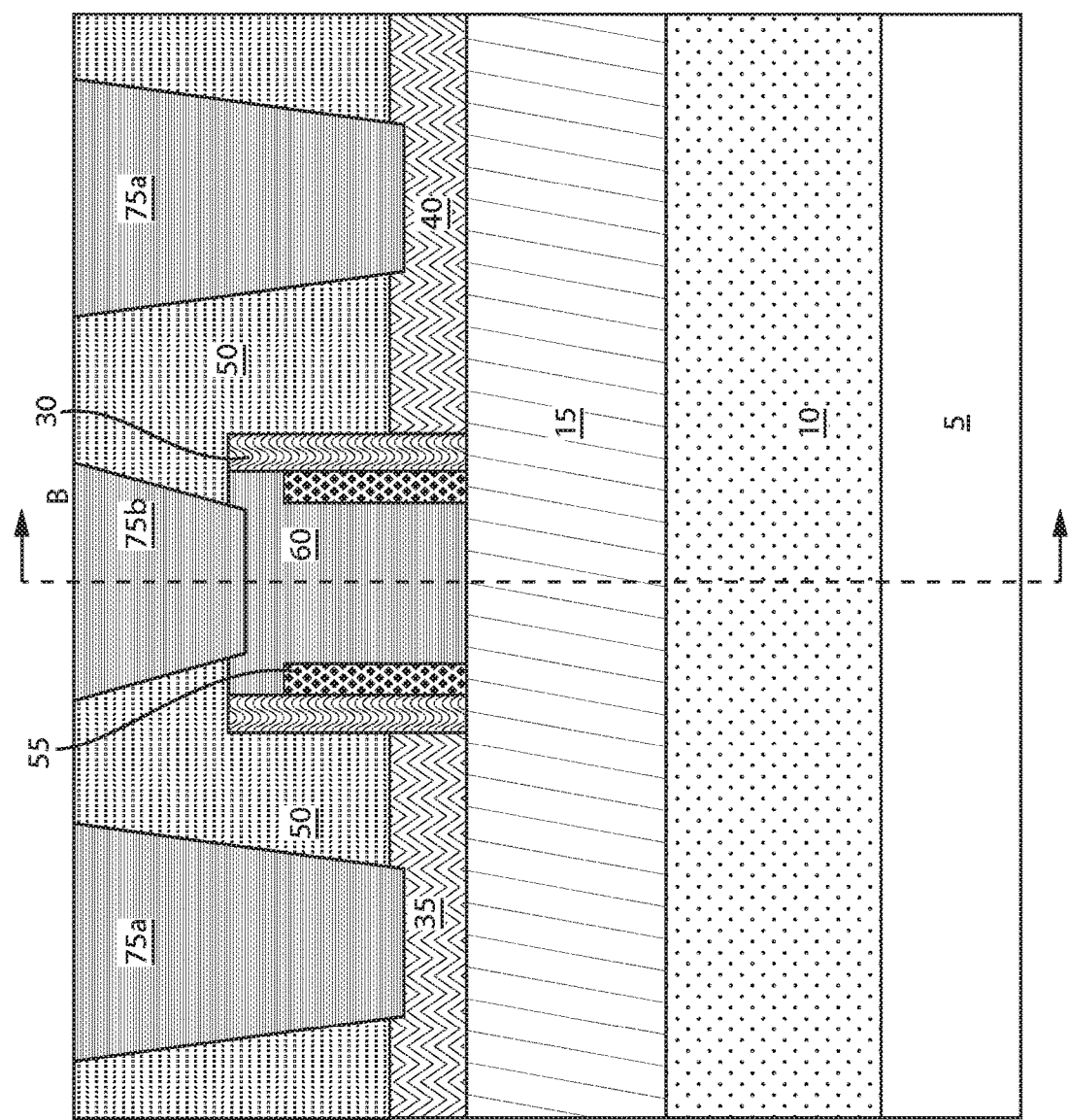
FIG. 10A is a side cross-sectional view depicting forming a gate contact to the gate electrode, and forming source and drain contacts to the epitaxial semiconductor material, that is depicted in FIG. 9A.
Figure 10B:
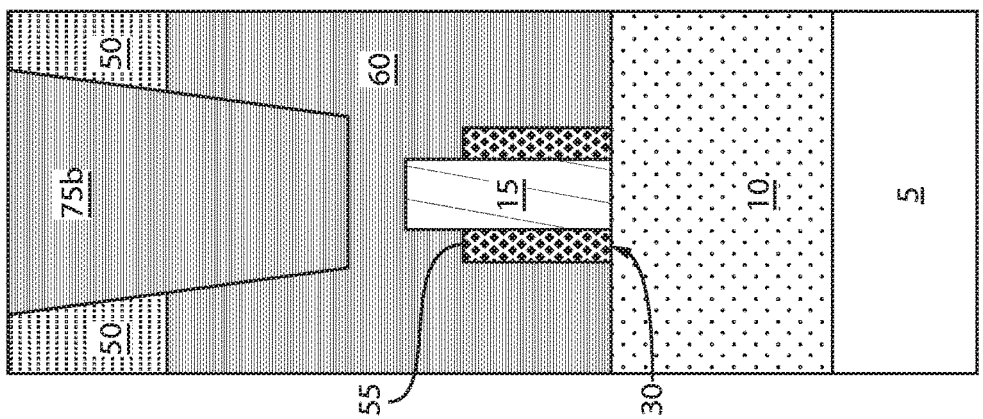
FIG. 10B is a side cross-sectional view along section line b-b of FIG. 10A.

FIGS. 10A-10B depict forming a gate contact 75b to the gate electrode, i.e., metal 60, and forming source and drain contacts 75a, 75b to the epitaxial semiconductor material 35, 40. Forming the contacts 75a, 75b may include depositing an interlevel dielectric layer, forming via openings in the interlevel dielectric to the gate electrode, i.e., metal 60, of the gate structure and the epitaxial material of the source and drain regions 35, 40, and filling the via openings with metal to provide the contacts 75a, 75b.

The interlevel dielectric layer is similar to the intralevel dielectric layer 50 described with reference to FIGS. 5A and 5B. Via openings may be formed through the interlevel dielectric layer using photolithography and etch processes. Following via formation, the contacts 75, 75b are formed by depositing a conductive metal into the via holes using deposition methods, such as CVD, sputtering or plating. The conductive metal may include, but is not limited to: tungsten, copper, aluminum, silver, gold and alloys thereof.

The methods and structures that have been described above with reference to FIGS. 1-10B may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

While the methods and structures of the present disclosure have been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method for forming the semiconductor device comprising:

forming a gate opening to a channel region of a fin structure;

forming a dielectric layer on the fin structure, in which an upper portion of the fin structure is exposed by removing a horizontally orientated portion of the dielectric layer, wherein a recessed vertically orientated portion of the dielectric layer remains; and forming a metal within the gate opening, wherein portions of the metal directly contacting the upper surface of fin structure provide a body contact to a partially depleted portion of the fin structure that reduces floating body effects, and a combination of the metal within the gate opening to the channel region of the fin structure and the dielectric layer provide a functional gate structure to the semiconductor device.

2. The method of claim 1, wherein the fin structure is doped to the partially depleted dopant level.

3. The method of claim 1, wherein forming the gate opening comprises:

forming a sacrificial gate structure on the channel region of the fin structure;

forming epitaxial source and drain regions on exposed portions of the fin structure on opposing sides of the sacrificial gate structure;

forming an intralevel dielectric layer having an upper surface coplanar with the sacrificial gate structure; and removing the sacrificial gate structure to provide the gate opening.

4. The method of claim 1, wherein the dielectric layer is a high-k dielectric material.

5. The method of claim 1, wherein said forming the dielectric layer on the fin structure, in which the upper portion of the fin structure is exposed comprises:

depositing the dielectric layer using a conformal deposition process on the channel region portion of the fin structure within the gate opening; and anisotropically etching the dielectric layer to remove the horizontally orientated portion of the dielectric layer from the upper surface of the fin structure.

6. The method of claim 5, wherein the conformal deposition process is chemical vapor deposition.

7. The method of claim 5, wherein said anisotropically etching the dielectric layer comprises reactive ion etching.

8. The method of claim 5, wherein the upper surface of the fin structure includes the upper $\frac{1}{3}$ of the fin structure height or less.

* * * * *